(12) United States Patent
Yamamoto

(10) Patent No.: US 6,900,850 B2
(45) Date of Patent: May 31, 2005

(54) TELEVISION TUNER HAVING SIMPLIFIED WIRING FOR INTERCONNECTION AND HAVING MINIATURIZED INTEGRATED CIRCUIT

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 526 days.

(21) Appl. No.: 10/165,684

(22) Filed: Jun. 7, 2002

(65) Prior Publication Data

US 2002/0186326 A1 Dec. 12, 2002

(30) Foreign Application Priority Data

Jun. 8, 2001 (JP) .................................... 2001-174674
Sep. 5, 2001 (JP) .................................... 2001-268901

(51) Int. Cl.[7] .............................................. H04N 5/50
(52) U.S. Cl. .................................... 348/731; 455/180.2
(58) Field of Search ............................ 348/731, 732, 348/725, 729, 735; 455/180.2, 180.3, 180.4; 334/47, 52

(56) References Cited

U.S. PATENT DOCUMENTS 4,783,849 A * 11/1988 Muterspaugh ............ 455/191.2
4,912,520 A * 3/1990 Yamamoto et al. .......... 455/333
5,210,204 A * 5/1993 Connor et al. ............... 548/144
5,319,318 A * 6/1994 Kunihisa et al. ............. 330/282
2002/0030530 A1 * 3/2002 Tsutsumi ..................... 327/365

FOREIGN PATENT DOCUMENTS

| DE | 198 19 544 | 11/1999 |
|----|-----------|---------|
| EP | 0 457 934 | 11/1991 |
| JP | 4-369918 | 12/1992 |
| JP | 2000-224007 | 8/2000 |
| WO | WO 98/15055 | 4/1998 |

OTHER PUBLICATIONS

International Search Report.

* cited by examiner

Primary Examiner—Victor R. Kostak
(74) Attorney, Agent, or Firm—Brinks Hofer Gilson & Lione

(57) ABSTRACT

A switching voltage generation circuit is provided with a first switch transistor, a second switch transistor, and a third switch transistor whose base is connected to the base of the second switch transistor. When a television signal of a UHF band is to be received, the first switch transistor is turned off, and the second and third switch transistors are turned on. When a television signal of a high band of a VHF band is to be received, the first switch transistor is turned on, and the second and third switch transistors are turned off. When a television signal of a low band of the VHF band is to be received, the first, second, and third switch transistors are turned off.

8 Claims, 4 Drawing Sheets

| BAND \ TRANSISTOR | TR2/TR3 | TR1 |
|---|---|---|
| UHF | ON | OFF |
| VHF Hi | OFF | ON |
| VHF Lo | OFF | OFF |

| TRANSISTOR<br>BAND | TR3 | TR2 | TR1 |
|---|---|---|---|
| UHF | ON | OFF | OFF |
| VHF Hi | OFF | ON | OFF |
| VHF Lo | OFF | OFF | ON |

TELEVISION TUNER HAVING SIMPLIFIED WIRING FOR INTERCONNECTION AND HAVING MINIATURIZED INTEGRATED CIRCUIT

BACKGROUND OF THE INVENTION

1. Field of the Invention

The present invention relates to a television tuner for receiving a television signal of a UHF band or a television signal of a VHF band and to a band switching circuit used in a television tuner.

2. Description of the Related Art

The construction of a conventional television tuner is shown in FIG. 4. A VHF input tuning circuit 33 is linked lie via a filter 32 for removing unwanted signals to an input end 31 to which a television signal of a VHF or UHF band is input. Inside the VHF input tuning circuit 33, a switch diode 33a, to the anode of which a voltage is applied, is provided, and the VHF input tuning circuit 33 is switched to tune to a high band or a low band of a VHF band in such a manner as to correspond to on/off of this switch diode. An illustration of a circuit for switching the on/off of the switch diode is omitted.

At the stage next to the VHF input tuning circuit 33, a first FET (dual-gate FET) 34 which is a constituent of a high-frequency amplifier is provided. A first gate (G1) is linked to the VHF input tuning circuit 33, and a second gate (G2) is high-frequency-grounded by a DC cut capacitor 35 and is connected to an AGC terminal 37 via a resistor 36. An AGC voltage is applied to the AGC terminal 37. Furthermore, the source (S) is grounded by a bias resistor 38 and is high-frequency-grounded by a DC cut capacitor 39. A VHF interstage tuning circuit (not shown) is connected to the drain (D), and a power voltage is supplied to the drain via the VHF interstage tuning circuit. Furthermore, the collector of a switch transistor 40 is connected to the first gate via a resistor 41, and the collector is connected to a power terminal 43 via a resistor 42. A power voltage is applied to the power terminal 43. The emitter is grounded.

The anode of a switch diode 44 is linked to the filter 32. A voltage from the VHF input tuning circuit 33 is supplied to the anode of the switch diode 44, and a UHF input tuning circuit 45 is linked to the cathode. The cathode of the switch diode 44 is connected to the collector of the switch transistor 40 via a resistor 46.

At the stage next to the UHF input tuning circuit 45, a second FET (dual-gate FET) 47 which is a constituent of a high-frequency amplifier is provided. The first gate of the second FET 47 is linked to the UHF input tuning circuit 45. One end of a peaking coil 48 is connected to the first gate, and the other end thereof is high-frequency-grounded by a DC cut capacitor 49. The connection point of the peaking coil 48 and the DC cut capacitor 49 is connected to a switch terminal 50 and is connected to the base of the switch transistor 40 via a resistor 51. Furthermore, the second gate is high-frequency-grounded by a DC cut capacitor 52 and is connected to the AGC terminal 37 via a resistor 53. Furthermore, the source is grounded by a bias resistor 54 and is high-frequency-grounded by a DC cut capacitor 55. A UHF interstage tuning circuit (not shown) is connected to the drain, and a power voltage is supplied to the drain via the UHF interstage tuning circuit.

In the above construction, when a UHF-band television signal is to be received, a high-level switching voltage is applied to the switch terminal 50. Just then, a predetermined bias voltage required for operation is applied to the first gate of the second FET 47, causing the second FET 47 to be placed in an operating state. At the same time, the switch transistor 40 is turned on, thereby the switch diode 44 is turned on, and thus it becomes possible for a television signal to be input to the UHF input tuning circuit 45. At this time, the voltage of the first gate of the first FET 34 becomes a bias voltage of 0 volts, and operation becomes impossible.

When a television signal of a VHF band is to be received, the switch terminal 50 reaches a low level. Therefore, the voltage of the second gate of the second FET 47 becomes a bias voltage of 0 volts, and operation becomes impossible, thereby the switch transistor 40 is turned off. For this reason, the switch diode 44 is also turned off, and thus a television signal is not input to the UHF input tuning circuit 45. Furthermore, since the switch transistor 40 is off, a predetermined bias voltage required for operation is applied to the first gate of the first FET 34.

A band switching circuit of a conventional television tuner is shown in FIG. 5. A VHF antenna tuning circuit 132 connected to an antenna terminal 131 is switched to tune to a high-band television signal or a low-band television signal of a VHF band according to on/off of a switch diode 132a provided in the VHF antenna tuning circuit.

At the stage next to the VHF antenna tuning circuit 132, a VHF amplifier 133 is provided, and at the stage next to the VHF amplifier 133, a VHF interstage tuning circuit 134 is provided.

The VHF interstage tuning circuit 134 is formed of a double tuning circuit, with a switch diode 134a being provided therein. Similarly to the VHF antenna tuning circuit 132, the VHF interstage tuning circuit 134 is switched to tune to a high-band television signal or a low-band television signal of a VHF band according to on/off of the switch diode 134a.

The cathode of the switch diode 132a in the VHF antenna tuning circuit 132 and the cathode of the switch diode 134a in the VHF interstage tuning circuit 134 are DC-grounded by means of a resistor (not shown).

At the stage subsequent to the VHF interstage tuning circuit 134, a VHF mixer (not shown), etc., are provided. The VHF antenna tuning circuit 132, the VHF amplifier 133, the VHF interstage tuning circuit 134, the VHF mixer, etc., constitute the VHF tuner section.

Furthermore, a UHF antenna tuning circuit 135 is connected to the antenna terminal 131, and at the stage next to the UHF antenna tuning circuit 135, a UHF amplifier 136 is provided. The UHF amplifier 136 is switched to an operating state only when a UHF-band television signal is to be received. At the stage next to the UHF amplifier 136, a UHF interstage tuning circuit 137 is provided. The UHF interstage tuning circuit 137 is also formed of a double tuning circuit. At the stage subsequent to the UHF interstage tuning circuit 137, a UHF mixer (not shown), etc., are provided. The UHF antenna tuning circuit 135, the UHF amplifier 136, the UHF interstage tuning circuit 137, the UHF mixer, etc., constitute the UHF tuner section.

The switching of the tuning frequency band between the VHF antenna tuning circuit 132 and the VHF interstage tuning circuit 134, and the operation switching of the UHF amplifier are performed by a switching voltage generation circuit 141. The switching voltage generation circuit 141 is formed within an integrated circuit 140. Inside the integrated circuit 140, in addition to the switching voltage generation circuit 141, an oscillation circuit, a PLL circuit, etc., are formed. However, illustrations of them are omitted.

The integrated circuit 140 is provided with at least four terminals 140a, 140b, 140c, and 140d related to the switching voltage generation circuit 141. Also, the switching voltage generation circuit 141 is provided with at least three independent switch transistors 141a, 141b, and 141c. The collector of each of the switch transistors 141a, 141b, and 141c is connected to the first terminal 140a. A power voltage is supplied to the first terminal 140a.

Furthermore, the emitter of the first switch transistor 141a is connected to the second terminal 140b, the emitter of the second switch transistor 141b is connected to the third terminal 140c, and the emitter of the third switch transistor 141c is connected to the fourth terminal 140d.

In addition, the second terminal 140b is DC-connected to the cathode of the switch diode 132a in the VHF antenna tuning circuit 132 and to the cathode of the switch diode 134a in the VHF interstage tuning circuit 134. The third terminal 140c is DC-connected to the anode of the switch diode 132a in the VHF antenna tuning circuit 132 and to the anode of the switch diode 134a in the VHF interstage tuning circuit 134. The fourth terminal 140d is connected to the bias voltage supply end of the UHF amplifier 136. Outside the integrated circuit 140, the series circuit of a resistor 142 and a diode 143 allows the third terminal 140c and the fourth terminal 140d to be connected to each other. The diode 143 is connected in an orientation such that the anode thereof is on the side of the fourth terminal 140d and the cathode thereof is on the side of the third terminal 140c.

A high-level or low-level control voltage for independently turning on/off each of the switch transistors 141a, 141b, and 141c is applied to their respective bases. Whether the control voltage becomes a high level or a low level is determined by a channel selection signal input to the integrated circuit 140. Each switch transistor is turned on in accordance with the high-level control voltage and is turned off in accordance with the low-level control voltage.

FIG. 6 shows the on/off state of each of the switch transistors 141a, 141b, and 141c when switching is made to a target band. In FIG. 6, reference character TR1 denotes a first switch transistor 141a. Reference character TR2 denotes a second switch transistor 141b. Reference character TR3 denotes a third switch transistor 141c.

First, when a UHF-band television signal is to be received, the first and second switch transistors 141a and 141b are turned off, and the third switch transistor 141c is turned on. Just then, a power voltage appears at the fourth terminal 140d, and this voltage is applied as a switching voltage to the UHF amplifier 136, causing the UHF amplifier 136 to be placed in an operating state. At this time, since a switching voltage is supplied to the anodes of the switch diodes 132a and 134a via the resistor 142 and the diode 143, these switch diodes are turned on, so that the VHF antenna tuning circuit 132 and the VHF interstage tuning circuit 134 are switched to tune to a high band of the VHF band. This avoids interference from each of the tuning circuits 132 and 134.

When a television signal of a high band of the VHF band is to be received, the first switch transistor 141a is turned off, the second switch transistor 141b is turned on, and the third switch transistor 141c is turned off. Just then, a power voltage appears at the third terminal 140c. This voltage is supplied as a switching voltage to the anode of each of the switch diodes 132a and 134a, these diodes are turned on, and each of the tuning circuits 132 and 134 tunes to the high band. At this time, the supply of the switching voltage to the UHF amplifier 136 is stopped by the diode 143.

Next, when a television signal of a low band of the VHF band is to be received, the first switch transistor 141a is turned on, and the second switch transistor 141b and the third switch transistor 141c are turned off. Just then, a power voltage appears at the second terminal 140b, this voltage is supplied as a switching voltage to the cathode of each of the switch diodes 132a and 134a, these diodes are turned off, and the two tuning circuits 132 and 134 tune to the low band.

As described above, the operation switching of the first FET 34 and the switch diode 44 is performed by the switch transistor 40. However, since individual parts are used for the first FET 34 and the second FET 47, problems arise in that wiring for an interconnection of the switch transistor 40 and each of the first FET 34 and the second FET 47 becomes complex, and the space factor when each part is disposed on a board is decreased.

SUMMARY OF THE INVENTION

Accordingly, an object of the present invention is to improve the degree of the integration of parts and to simplify wiring for interconnection.

The switching of the tuning band between a VHF antenna tuning circuit and a VHF interstage tuning circuit, and the operation switching of a UHF amplifier are performed by a switching voltage generation circuit. Since a switching voltage is supplied to the anode and the cathode of a switch diode, four terminals related to the switching voltage generation circuit are provided in an integrated circuit. For this reason, the wiring for connecting between each of the tuning circuits and the integrated circuit is complex. Furthermore, since the number of terminals of the integrated circuit is large, size reduction cannot be achieved.

Another object of the present invention is to decrease the number of terminals of a switching voltage generation circuit, to simplify the wiring for connection with tuning circuits, and to reduce the size of an integrated circuit which is a constituent of the switching voltage generation circuit.

To achieve the above-mentioned objects, in one aspect, the present invention provides a television tuner comprising: a first dual-gate FET, to the first gate of which a television signal of a VHF band is input; a second dual-gate FET, to the first gate of which a television signal of a UHF band and a high-level or low-level switching voltage are input; and a third single-gate FET, to the drain of which a voltage is applied via a pull-up resistor, wherein the first, second, and third FETs are formed into an integrated circuit within the same package and form an integrated circuit part, inside the integrated circuit part, the section between the second gates of the first and second FETs is DC-connected, the section between the source of the third FET and the source of the first FET is DC-connected, the section between the gate of the third FET and the first gate of the second FET is DC-connected, the section between the drain of the third FET and the first gate of the first FET is connected by a first resistor, an AGC voltage is applied to the second gate of the first FET, and the sources are grounded.

The second gate of the first FET is preferably connected to the second gate of the second FET by a second resistor inside the integrated circuit part.

Preferably, the source of the first FET is connected to the source of the second FET by a third resistor inside the integrated circuit part, the source of the first FET is directly grounded, and the source of the second FET is grounded via a feedback capacitor.

The gate of the third FET is preferably connected to the first gate of the second FET by a fourth resistor inside the integrated circuit part.

In another aspect, the present invention provides a band switching circuit for a television tuner, the band switching circuit comprising: a VHF tuning circuit, having a switch diode, a power voltage being applied to the anode thereof, the VHF tuning circuit being switched to tune to a high band or a low band of a VHF band according to on/off of the switch diode; a UHF amplifier for amplifying a television signal of a UHF band; and a switching voltage generation circuit for turning on/off the diode and for applying a power voltage to the UHF amplifier, wherein the switching voltage generation circuit is provided with a first switch transistor whose emitter is grounded, a second switch transistor, to the collector of which a power voltage is applied, and a third switch transistor whose emitter is grounded and whose base is connected to the base of the second switch transistor, the collectors of the first and third switch transistors are DC-connected to the cathode of the switch diode, the emitter of the second switch transistor is connected to the UHF amplifier, the first switch transistor is turned off and the second and third switch transistors are turned on when a television signal of a UHF band is to be received, the first switch transistor is turned on and the second and third switch transistors are turned off when a television signal of a high band is to be received, and the first, second, and third switch transistors are turned off when a television signal of a low band is to be received.

The collector of the second switch transistor is preferably connected to the collector of the first switch transistor via a first resistor.

The section between the anode and the cathode of the switch diode is preferably DC-connected by a second resistor.

The band switching circuit for a television tuner may further comprise an integrated circuit having the switching voltage generation circuit formed therein, wherein the integrated circuit is provided with a first terminal to which a power voltage is supplied, a second terminal to which the collector of the first switch transistor is connected, and a third terminal to which the emitter of the second switch transistor is connected, and the collector of the second switch transistor is connected to the first terminal inside the integrated circuit.

DESCRIPTION OF THE PREFERRED EMBODIMENTS

Figure 1:
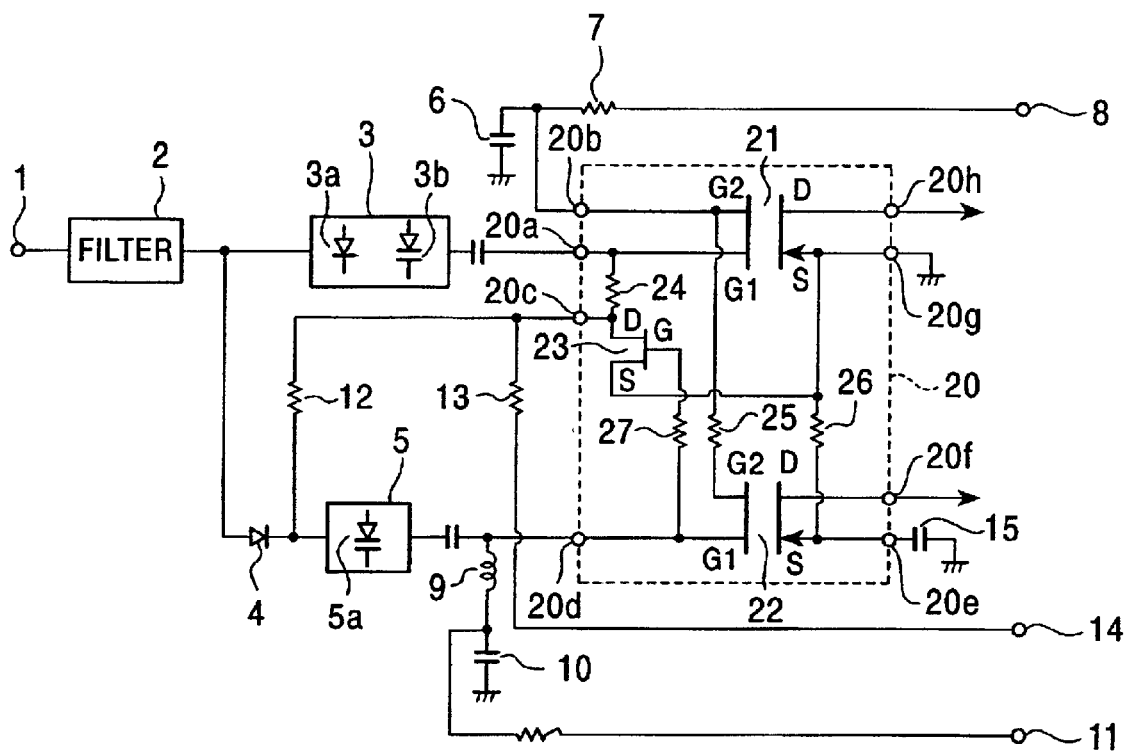
FIG. 1 is a circuit diagram showing the construction of a television tuner according-to the present invention.

The construction of a television tuner of the present invention is shown in FIG. 1. A television signal of a VHF band or a television signal of a UHF band is input to an input end 1. A VHF input tuning circuit 3 is linked to the input end 1 via a filter 2 for removing unwanted signals. The VHF input tuning circuit 3 is a band-switching-type tuning circuit, in which a switch diode 3a and a varactor diode 3b, to the anodes of which a voltage is applied, are provided. The VHF input tuning circuit 3 is switched to tune to a high band or a low band of a VHF band in such a manner as to correspond to on/off of the switch diode 3a. The tuning frequency is varied by the varactor diode. An illustration of a circuit for switching the VHF input tuning circuit 3 and the on/off of the switch diode 3a is omitted.

A UHF input tuning circuit 5 is linked to the filter 2 via a switch diode 4. A voltage is applied to the anode of the switch diode 4 from the VHF input tuning circuit 3. The UHF input tuning circuit 5 is provided with a varactor diode 5a, so that the tuning frequency is varied by the varactor diode 5a. The output end of the VHF input tuning circuit 3 and the output end of the UHF input tuning circuit 5 are each linked to an integrated circuit part 20. Inside the integrated circuit part 20, first and second dual-gate FETs 21 and 22, a third single-gate FET 23, and resistors which connect these FETs to each other are formed into an integrated circuit within the same package.

More specifically, inside the integrated circuit part 20, the section between a first gate (G1) of the first FET 21 and the drain (D) of the third FET 23 is connected by a first resistor 24 having resistance of several tens of kΩ. The section between a second gate (G2) of the first FET 21 and a second gate of the second FET 22 is connected by a second resistor 25 having resistance of several tens of kΩ. The section between the source (S) of the first FET 21 and the source of the second FET 22 is connected by a third resistor 26 having resistance of several tens of kΩ. The section between the gate (G) of the third FET 23 and the first gate of the second FET 22 is connected by a fourth resistor 27 having resistance of several tens of kΩ.

The integrated circuit part 20 is provided with a first external terminal 20a connected to the first gate of the first FET 21, a second external terminal 20b connected to the second gate of the first FET 21, a third external terminal 20c connected to the drain of the third FET 23, a fourth external terminal 20d connected to the first gate of the second FET 22, a fifth external terminal 20e connected to the source of the second FET 22, a sixth external terminal 20f connected to the drain of the second FET 22, a seventh external terminal 20g connected to the source of the first FET 21, and an eighth external terminal 20h connected to the drain of the first FET 21.

Then, the output end of the VHF input tuning circuit 3 is connected to the first external terminal 20a, and the output end of the UHF input tuning circuit 5 is connected to the fourth external terminal 20d. As a result, a television signal of a VHF band is input to the first gate of the first FET 21, and a television signal of a UHF band is input to the first gate of the second FET 22. The second external terminal 20b is high-frequency-grounded by a DC cut capacitor 6 and is connected to an AGC terminal 8 via a resistor 7. An AGC voltage is applied to the AGC terminal. This causes an AGC voltage to be applied to the second gates of the first FET 21 and the second FET 22.

One end of a peaking coil 9 is connected to the fourth external terminal 20d, and the other end thereof is high-frequency-grounded by a DC cut capacitor 10 and is connected to a switching terminal 11. A switching voltage applied to the switching terminal 11 reaches a high level when a television signal of a UHF band is to be received and reaches a low level when a television signal of a VHF band is to be received.

Furthermore, the third external terminal 20c is connected to the cathode of the switch diode 4 via a resistor 12 and is connected to a power terminal 14 via a pull-up resistor 13.

A VHF interstage tuning circuit (not shown) is connected to an eighth external terminal 20h. A power voltage is applied to the VHF interstage tuning circuit, and this voltage is supplied to the drain of the first FET 21 via the eighth external terminal 20h. The seventh external terminal 20g is directly grounded.

A UHF interstage tuning circuit (not shown) is connected to the sixth external terminal 20f. A power voltage is applied to the UHF interstage tuning circuit, and this voltage is supplied to the drain of the second FET 22 via the sixth external terminal 20f. The fifth external terminal 20e is grounded by a capacitor 15. The capacitor 15 has some degree of impedance in the UHF band.

With the above-described construction, when a television signal of a UHF band is to be received, a high-level switching voltage is applied to the switching terminal 11. Just then, a predetermined bias voltage required for operation is applied to the first gate of the second FET 22, causing the second FET 22 to be placed in an operating state. At the same time, the third FET 23 is turned on, thereby the switch diode 4 is turned on, and thus it becomes possible for a television signal to be input to the UHF input tuning circuit 5. Then, the television signal selected by the UHF input tuning circuit 5 is input to the first gate of the second FET 22. In this state, since the fourth resistor 27 is connected between the first gate of the second FET 22 and the gate of the third FET 23, the input television signal of the UHF band will not be attenuated. Furthermore, in the amplification operation of the second FET 22, a negative feedback is applied by the feedback capacitor 15 connected to the source and the third resistor 26 inside the integrated circuit part 20, a gain of the frequency of a lower region of the UHF band is suppressed, and an almost flat gain in the entire UHF band is obtained.

Furthermore, since an AGC voltage is applied to the second gate of the second FET 22 via the second resistor 25, this also causes a negative feedback to be applied, and parasitic oscillation is not likely to occur. Furthermore, distortion in a state in which, in particular, an AGC voltage is decreased to attenuate the gain by approximately 35 dB, is reduced.

As a result of the third FET 23 becoming on, the voltage of the first gate of the first FET 21 becomes a bias voltage of 0 volts, and operation becomes impossible.

On the other hand, when a television signal of a VHF band is to be received, a low-level switching voltage is applied to the switching terminal 11. Just then, the voltage of the second gate of the second FET 22 becomes a bias voltage of 0 volts, and operation becomes impossible. Furthermore, since the third FET 23 becomes off, the switch diode 4 also becomes off, and a television signal is not input to the UHF input tuning circuit 5. Furthermore, since the third FET 23 is off, a predetermined bias voltage required for operation is applied to the first gate of the first FET 21, and the first FET 21 becomes possible to operate. Then, the television signal of the VHF band selected by the VHF input tuning circuit 3 is input to the first gate of the first FET 21, whereby the signal is amplified. In this case, since the drain of the third FET 23 and the first gate of the first FET 21 are connected to each other by the first resistor 24, the output capacitance components possessed by the third FET 23 are not directly coupled to the first gate. For this reason, since these output capacitance components are not added to the VHF input tuning circuit 3, the varying range of the tuning frequency of the VHF input tuning circuit 3 is not decreased.

Figures 2, 3:
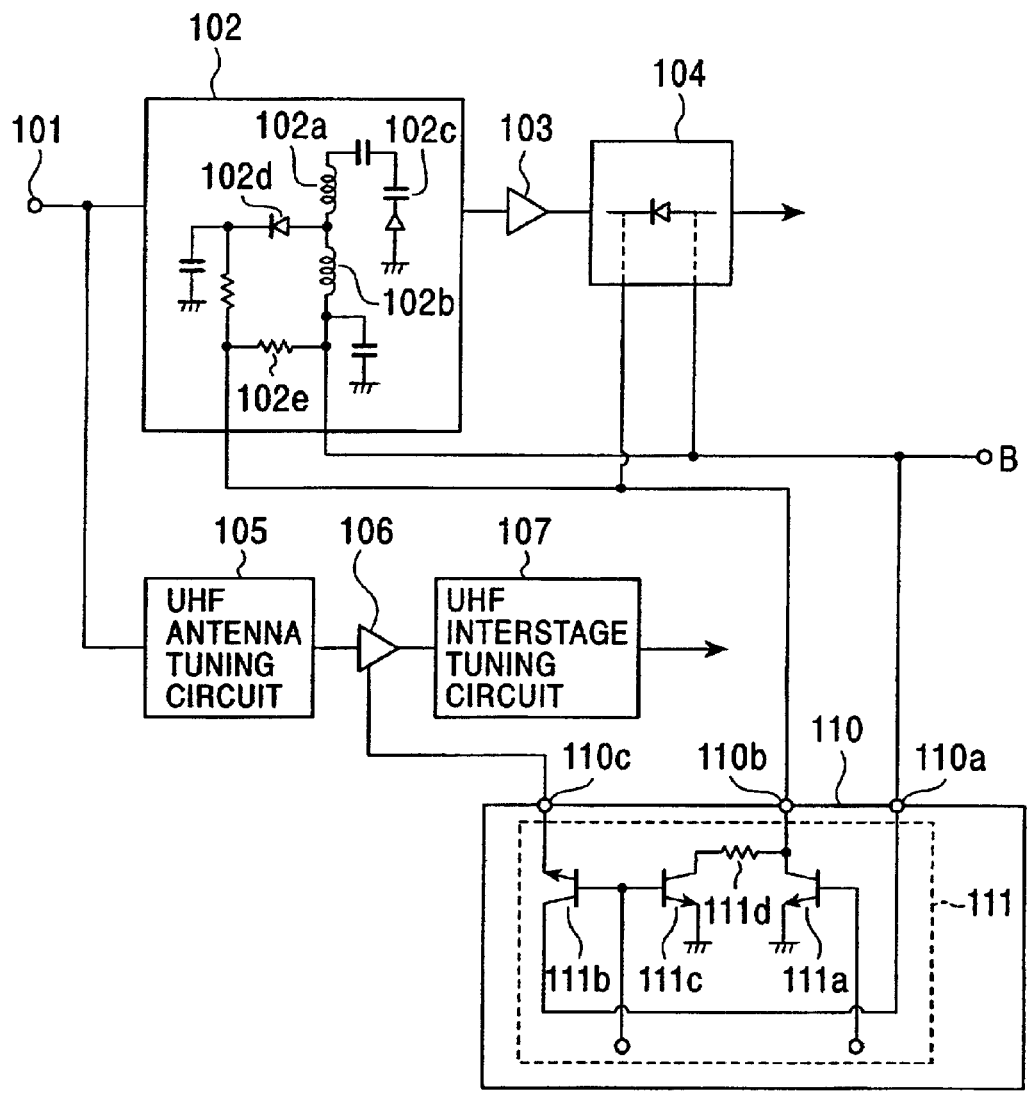
FIG. 2 is a circuit diagram showing a band switching circuit of the television tuner according to the present invention.
FIG. 3 is a switched-state diagram in the band switching circuit of the television tuner according to the present invention.
Figure 4:
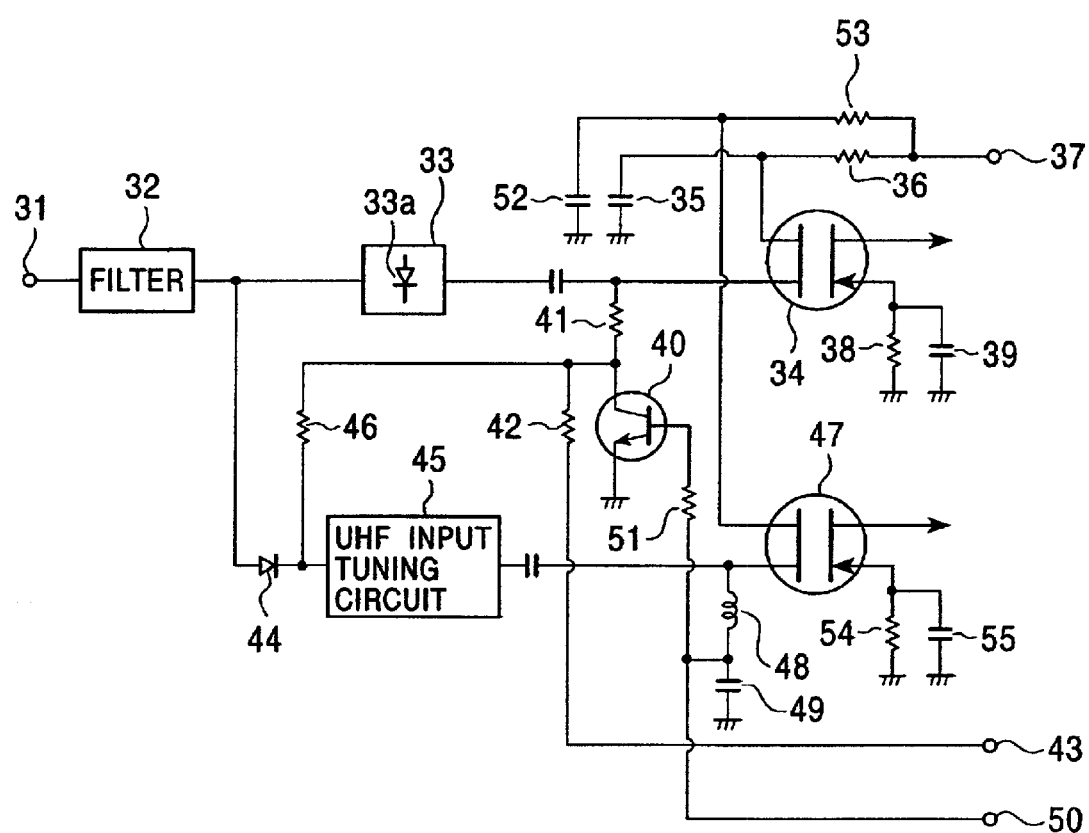
FIG. 4 is a circuit diagram showing the construction of a conventional television tuner.
Figures 5, 6:
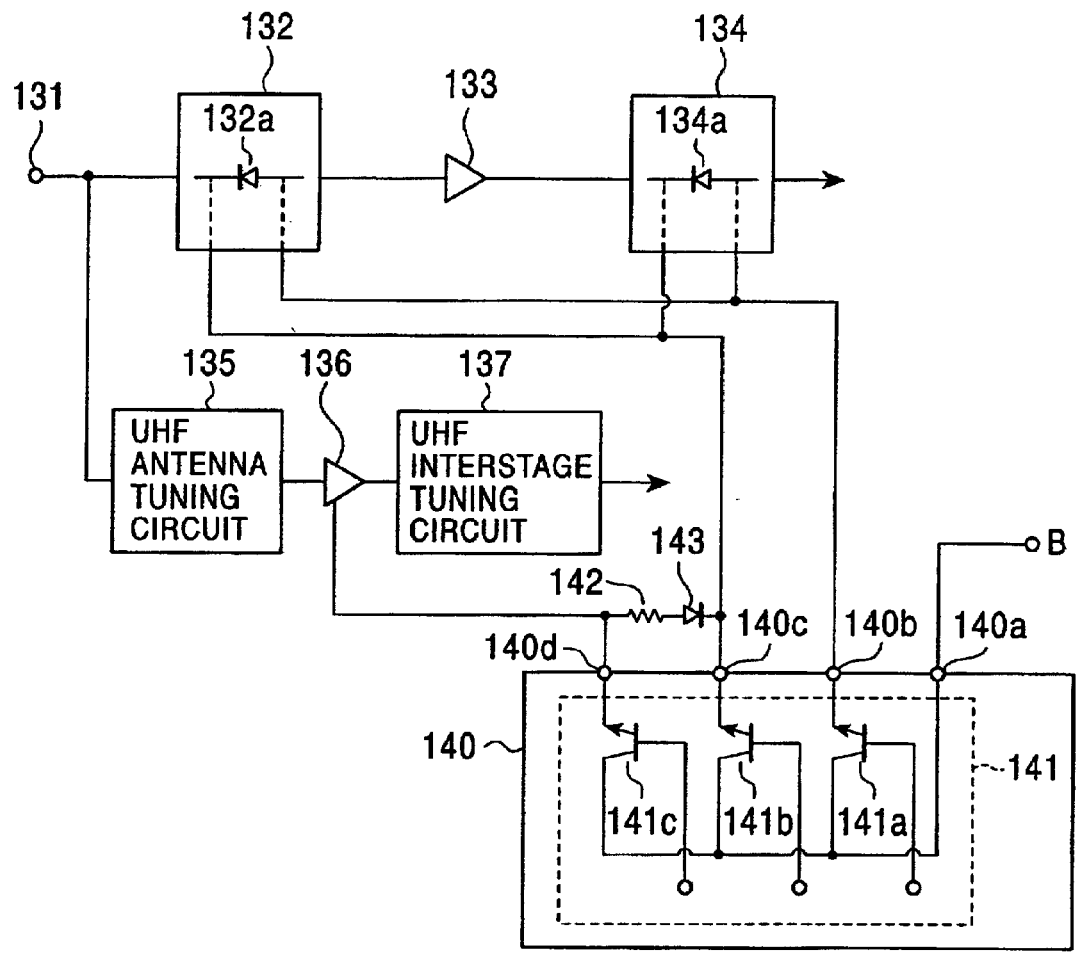
FIG. 5 is a circuit diagram showing a band switching circuit of the conventional television tuner.
FIG. 6 is a switched-state diagram in the band switching circuit of the conventional television tuner.

A band switching circuit for the television tuner of the present invention is shown in FIG. 2.

A VHF antenna tuning circuit 102 connected to an antenna terminal 101 has at least two inductance elements 102a and 102b which are connected in series, a varactor diode 102c which is high-frequency-connected in parallel to these elements, and a switch diode 102d whose anode is connected to the connection point of the two inductance elements 102a and 102b and which is high-frequency-connected in parallel to one of the inductance elements 102b, with a second resistor 102e being connected in parallel to the switch diode 102d via one of the inductance elements 102b. A power voltage B is applied to the anode of the switch diode 102d via one of the inductance elements 102b.

The VHF antenna tuning circuit 102 constructed as described above is switched to tune to a television signal of a high band or a low band of a VHF band according to on/off of the switch diode 102d.

The tuning frequency is set in accordance with a tuning voltage supplied to the cathode of the varactor diode 102c.

At the stage next to the VHF antenna tuning circuit 102, a VHF amplifier 103 is provided, and at the stage next to the VHF amplifier 103, a VHF interstage tuning circuit 104 is provided.

The VHF interstage tuning circuit 104 is formed of a double tuning circuit. Although a detailed illustration is omitted, similarly to the VHF antenna tuning circuit 102, the VHF interstage tuning circuit 104 has a switch diode 104a, to the anode of which a power voltage is applied, and the VHF interstage tuning circuit 104 is switched to tune to a television signal of a high band or a low band of a VHF band according to on/off of the switch diode 104a.

At the stage subsequent to the VHF interstage tuning circuit 104, a VHF mixer (not shown), etc., are provided. The VHF antenna tuning circuit 102, the VHF amplifier 103, the VHF interstage tuning circuit 104, the VHF mixer, etc., constitute a VHF tuner section.

Furthermore, a UHF antenna tuning circuit 105 is connected to the antenna terminal 101, and at the stage next to the UHF antenna tuning circuit 105, a UHF amplifier 106 is provided. The UHF amplifier 106 is switched to an operating state only when a television signal of a UHF band is to be received. At the stage next to the UHF amplifier 106, a UHF interstage tuning circuit 107 is provided. The UHF interstage tuning circuit 107 is also formed of a double tuning circuit. At the stage subsequent to the UHF interstage tuning circuit 107, a UHF mixer (not shown), etc., are provided. The UHF antenna tuning circuit 105, the UHF amplifier 106, the UHF interstage tuning circuit 107, the UHF mixer, etc., constitute a UHF tuner section.

The switching of the tuning frequency band of the VHF antenna tuning circuit 102 and the VHF interstage tuning circuit 104, and the operation switching of the UHF antenna tuning circuit 105 are performed by a switching voltage generation circuit 111. The switching voltage generation circuit 111 is formed inside an integrated circuit 110. Inside the integrated circuit 110, in addition to the switching voltage generation circuit 111, an oscillation circuit, a PLL circuit, etc., are formed. However, illustrations of them are omitted.

The integrated circuit 110 is provided with at least three terminals 110a, 110b, and 10c related to the switching voltage generation circuit 111. The switching voltage generation circuit 111 is provided with three NPN-type switch transistors 111a, 111b, and 111c. The emitters of the first switch transistor 111a and the third switch transistor 111c are grounded, and their respective collectors are connected to each other by a first resistor 111d. The collector of the second switch transistor 111b is connected to the first terminal 110a inside the integrated circuit 110. The base of the second switch transistor 111b and the base of the third switch transistor 111c are connected to each other.

Then, a power voltage B is applied to the first terminal 110a. The second terminal 110b is DC-connected to the cathode of the switch diode 102d in the VHF antenna tuning circuit 102 and to the cathode of a switch diode 104a in the VHF interstage tuning circuit 104. The third terminal 110c is connected to the bias voltage supply end of the UHF amplifier 106.

A high-level or low-level control voltage for turning on/off the first, second, and third switch transistors 111a, 111b, and 111c is applied to their respective bases. Whether the control voltage becomes a high level or a low level is determined by a channel selection signal input to the integrated circuit 110. Each switch transistor is turned on in accordance with the high-level control voltage and is turned off in accordance with the low-level control voltage.

FIG. 3 shows a state in which each switch transistor is turned on/off when switching is made to a target band. In FIG. 3 reference character TR1 denotes a first switch transistor 111a. Reference character TR2 denotes a second switch transistor 111b. Reference character TR3 denotes a third switch transistor 111c.

First, when a television signal of a UHF band is to be received, the first switch transistor 111a is turned off, and the second and third switch transistors 111b and 111c are turned on. Just then, a power voltage appears at the third terminal 110c, and this voltage is applied as a switching voltage to the UHF amplifier 106, causing the UHF amplifier 106 to be placed in an operating state. Furthermore, as a result of the third switch transistor 111c becoming on, the switch diode 102d in the VHF antenna tuning circuit 102 and the switch diode 104a in the VHF interstage tuning circuit 104 are turned on. The on current flows through the first resistor 111d. Then, the tuning circuits 102 and 104 are switched to tune to the high band. This avoids interference from each of the tuning circuits 102 and 104.

When a television signal of a high band of a VHF band is to be received, the first switch transistor 111a is turned on, and the second and third switch transistors 111b and 111c are turned off. Just then, the switch diode 102d in the VHF antenna tuning circuit 102 and the switch diode 104a in the VHF interstage tuning circuit 104 are turned on, so that each of the switch diodes 102 and 104 is switched to tune to the high band.

However, since the electric current flowing through the switch diodes 102d and 104a flows into the first resistor 111a, the electric current becomes larger than that for the UHF band, and loss by the switch diodes 102d and 104a is reduced.

On the other hand, since a power voltage does not appear at the third terminal 110c, a switching voltage is not supplied to the UHF amplifier 106.

When a television signal of a low band of a VHF band is to be received, all the first, second, and third switch transistors 111a, 111b, and 111c are turned off. As a result, the switch diode 102d in the VHF antenna tuning circuit 102 and the switch diode 104a in the VHF interstage tuning circuit 104 are turned off, so that each of the tuning circuits 102 and 104 is switched to tune to a low band. A switching voltage is not supplied to the UHF amplifier 106.

When the switch diode 102d is turned off, since the section between the anode and the cathode thereof is maintained at the same electrical potential by the second resistor 102e, the switch diode 102d in an off state will not become unstable. This applies the same to the switch diode 104a in the VHF interstage tuning circuit 104.

As has thus been described, the first, second, and third FETs are formed into an integrated circuit within the same package and constitute an integrated circuit part. Inside the integrated circuit part, the section between the second gates of the first and second FETs, the section between the source of the third FET and the source of the first FET, and the section between the gate of the third FET and the first gate of the second FET, are each DC-connected. Furthermore, the section between the drain of the third FET and the first gate of the first FET is connected by a first resistor, an AGC voltage is applied to the second gate of the first FET, and the sources are grounded. Therefore, the circuit wiring outside the integrated circuit part is simplified, and this contributes to a reduced size.

Furthermore, since the second gate of the first FET and the second gate of the second FET are connected to each other by a second resistor inside the integrated circuit part, an AGC voltage is applied to the second gate of the second FET via a second resistor, a negative feedback is applied to the second FET, and parasitic oscillation is not likely to occur. Furthermore, distortion in a state in which, in particular, an AGC voltage is decreased to attenuate the gain by approximately 35 dB, is reduced.

Furthermore, since the source of the first FET and the source of the second FET are connected to each other by a third resistor inside the integrated circuit part and since the source of the first FET is directly grounded, the third FET becomes likely to be turned on. Furthermore, since the source of the second FET is grounded via a feedback capacitor, in the amplification operation of the second FET, a negative feedback is applied by the feedback capacitor connected to the source and the third resistor inside the integrated circuit part, a gain of the frequency of a lower region of the UHF band is suppressed, and an almost flat gain in the entire UHF band is obtained.

Furthermore, since the gate of the third FET and the first gate of the second FET are connected to each other by a fourth resistor inside the integrated circuit part, the input television signal of the UHF band will not be attenuated.

As has thus been described, in the present invention, the switching voltage generation circuit is provided with a first switch transistor whose emitter is grounded, a second switch transistor, to the collector of which a power voltage is applied, and a third switch transistor whose emitter is grounded and whose base is connected to the base of the second switch transistor. The collectors of the first and third switch transistors are DC-connected to the cathode of the switch diode, and the emitter of the second switch transistor is connected to a UHF amplifier. When a television signal of a UHF band is to be received, the first switch transistor is turned off and the second and third switch transistors are turned on. When a television signal of a high band is to be received, the first switch transistor is turned on and the second and third switch transistors are turned off. When a television signal of a low band is to be received, the first, second, and third switch transistors are turned off. Therefore, the connection between the switching voltage generation circuit and the switch diodes of the tuning circuit and between the switching voltage generation circuit and the UHF amplifier are simplified.

Furthermore, since the collector of the second switch transistor is connected to the collector of the first switch transistor via a first resistor, the electric current which flows through a switch diode when the third switch transistor is turned on can be decreased when a television signal of a UHF band is to be received, and the electric current can be increased when a television signal of a VHF band is to be received.

Furthermore, since the section between the anode and the cathode of the switch diode is DC-connected by a second resistor, when the switch diode is off, this will not become unstable.

Furthermore, the band switching circuit has an integrated circuit having a switching voltage generation circuit formed therein. The integrated circuit is provided with a first terminal to which a power voltage is supplied, a second terminal to which the collector of the first switch transistor is connected, and a third terminal to which the emitter of the second switch transistor is connected. The collector of the second switch transistor is connected to the first terminal inside the integrated circuit. Therefore, the number of terminals of the integrated circuit is decreased, and this is advantageous for a reduced size of this circuit.

What is claimed is:

1. A television tuner comprising:
   a first dual-gate FET, to a first gate of which a television signal of a VHF band is input;
   a second dual-gate FET, to a first gate of which a television signal of a UHF band and one of a high-level and low-level switching voltage are input; and
   a third single-gate FET, to a drain of which a voltage is applied via a pull-up resistor,
   wherein the first, second, and third FETs are formed into an integrated circuit within a same package end form an integrated circuit part, inside the integrated circuit part, a section between second gates of the first and second FETs is DC-connected, a section between a source of the third FET and a source of the first FET is DC-connected, a section between a gate of the third FET and the first gate of the second FET is DC-connected, a section between the drain of the third FET and the first gate of the first FET is connected by a first resistor, an AGC voltage is applied to the second gate of the first FET, and the source of the first FET is grounded.

2. A television tuner according to claim 1, wherein the second gate of the first FET is connected to the second gate of the second FET by a second resistor inside the integrated circuit part.

3. A television tuner according to claim 1, wherein the source of the first FET is connected to a source of the second FET by a third resistor inside the integrated circuit part, the source of the first FET is directly grounded, and the source of the second FET is grounded via a feedback capacitor.

4. A television tuner according to claim 1, wherein the gate of the third FET is connected to the first gate of the second FET by a fourth resistor inside the integrated circuit part.

5. A band switching circuit for a television tuner, the band switching circuit comprising:
   a VHF tuning circuit, having a switch diode, a first power voltage being applied to an anode thereof, the VHF tuning circuit being switched to tune to one of a high band and a low band of a VHF band according to on/off of the switch diode;
   a UHF amplifier to amplify a television signal of a UHF band; and
   a switching voltage generation circuit to turn on/off the diode and to apply a second power voltage to the UHF amplifier,
   wherein the switching voltage generation circuit is provided with a first switch transistor whose emitter is grounded, a second switch transistor, to a collector of which a third power voltage is applied, and a third switch transistor whose emitter is grounded and whose base is connected to a base of the second switch transistor,
   collectors of the first and third switch transistors are DC-connected to a cathode of the switch diode, an emitter of the second switch transistor is connected to the UHF amplifier, the first switch transistor is turned off end the second and third switch transistors are turned on when a television signal of a UHF band is to be received, the first switch transistor is turned on and the second and third switch transistors are turned off when a television signal of a high band is to be received, and the first, second, and third switch transistors are turned off when a television signal of a low band is to be received.

6. A band switching circuit for a television tuner according to claim 5, wherein the collector of the second switch transistor is connected to the collector of the first switch transistor via a first resistor.

7. A band switching circuit for a television tuner according to claim 5, wherein a section between the anode and the cathode of the switch diode is DC-connected by a second resistor.

8. A band switching circuit for a television tuner according to claim 5, further comprising an integrated circuit having the switching voltage generation circuit formed therein,
   wherein the integrated circuit is provided with a first terminal to which a power voltage is supplied, a second terminal to which the collector of the first switch transistor is connected, and a third terminal to which the emitter of the second switch transistor is connected, and
   the collector of the second switch transistor is connected to the first terminal inside the integrated circuit.

* * * * *